(12) United States Patent
Matsuba

(10) Patent No.: US 8,088,203 B2
(45) Date of Patent: Jan. 3, 2012

(54) AUTOMATED WAREHOUSE AND METHOD OF CONTROLLING CLEAN ENVIRONMENT IN THE AUTOMATED WAREHOUSE

(75) Inventor: Katsumi Matsuba, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 400 days.

(21) Appl. No.: 12/414,874

(22) Filed: Mar. 31, 2009

(65) Prior Publication Data

US 2009/0245985 A1   Oct. 1, 2009

(30) Foreign Application Priority Data

Apr. 1, 2008 (JP) ................................ 2008-094990

(51) Int. Cl.
B01D 46/46 (2006.01)
(52) U.S. Cl. ......... 96/417; 55/385.1; 55/385.2; 454/187
(58) Field of Classification Search .................. 55/385.1, 55/385.2, 385.6; 454/187; 250/216, 234, 250/239; 73/861; 414/270, 274
See application file for complete search history.

(56) References Cited

U.S. PATENT DOCUMENTS 6,399,518 B1   6/2002  Ueda
7,902,492 B2 * 3/2011 Matsuba ...................... 250/216

FOREIGN PATENT DOCUMENTS

| JP | 05-207611 A | 8/1993 |
| JP | 08-133482 A | 5/1996 |
| JP | 2001-044119 A | 2/2001 |
| JP | 2003-026306 A | 1/2003 |
| JP | 2007-276937 A | 10/2007 |
| JP | 2007-297196 A | 11/2007 |
| JP | 2008-007225 A | 1/2008 |
| JP | 2010-120768 A | * 6/2010 |

OTHER PUBLICATIONS

Official Communication issued in corresponding Japanese Patent Application No. 2008-094990, mailed on Mar. 2, 2010.
Official Communication issued in corresponding Japanese Patent Application No. 2008-094990, mailed on Jun. 11, 2010.
Official Communication issued in corresponding Japanese Patent Application No. 2008-094990, mailed on Dec. 10, 2009.

* cited by examiner

*Primary Examiner* — Duane Smith
*Assistant Examiner* — Minh-Chau Pham
(74) *Attorney, Agent, or Firm* — Keating & Bennett, LLP

(57) ABSTRACT

A measuring unit arranged to measure a clean environment is placed on a cell by a retrieval and storage apparatus to measure clean environment of the cell. Based on a measurement result, a fan filter unit or an exhaust vent is controlled to maintain the clean environment of the cell at a predetermined level or more.

5 Claims, 5 Drawing Sheets

F I G. 1
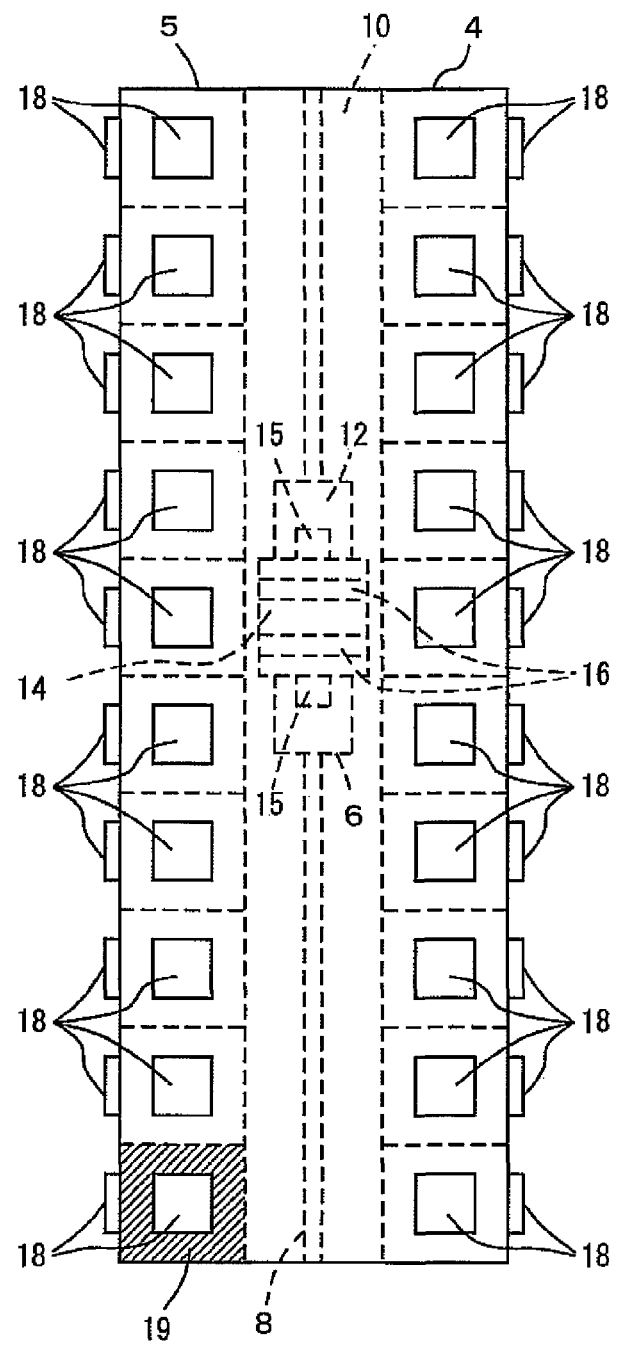

AUTOMATED WAREHOUSE AND METHOD OF CONTROLLING CLEAN ENVIRONMENT IN THE AUTOMATED WAREHOUSE

BACKGROUND OF THE INVENTION

1. Field of the Invention

The present invention relates to an automated warehouse, e.g., used in a clean room. More specifically, the present invention relates to measurement of an environment in the automated warehouse.

2. Description of the Related Art

A technique of providing a measuring unit equipped with a sensor for measuring cleanness, and placing the measuring unit in each cell of an automated warehouse using retrieval and storage apparatuses for measuring environment in the cell is known in the art (see, for example, JP 2007-297196A). In this manner, it is possible to measure the environment in each cell and an ambient environment of articles that are being transported by the retrieval and storage apparatuses.

SUMMARY OF THE INVENTION

Preferred embodiments of the present invention work to maintain a clean environment in an automated warehouse, thereby effectively preventing contamination of articles in stock.

Preferred embodiments of the present invention also maintain vibrations applied to articles during transportation at a predetermined level or less, thereby effectively preventing the articles from being adversely affected.

According to a preferred embodiment of the present invention, an automated warehouse includes cells, a retrieval and storage apparatus, a fan filter unit arranged to supply clean air, an exhaust port having an adjustable opening, and a measuring unit arranged to measure a clean environment. The retrieval and storage apparatus is capable of transporting the measuring unit, and transferring the measuring unit to and from the cells.

The measuring unit measures the clean environment of the cells. The automated warehouse further includes a control device arranged to control at least one of the fan filter unit and the opening of the exhaust port to maintain the clean environment of the cells at a predetermined level or more.

Further, according to another preferred embodiment of the present invention, a method of controlling a clean environment in an automated warehouse is provided. The automated warehouse includes cells, a retrieval and storage apparatus, a fan filter unit arranged to supply clean air, an exhaust port having an adjustable opening, and a measuring unit arranged to measure the clean environment. The retrieval and storage apparatus is capable of transporting the measuring unit, and transferring the measuring unit to and from the cells.

The method includes the steps of measuring the clean environment of the cells through the measuring unit, and controlling at least one of the fan filter unit and the opening of the exhaust port based on a measurement result to maintain the clean environment of the cells at a predetermined level or more.

Preferably, the retrieval and storage apparatus transfers the measuring unit to only some of the cells in the automated warehouse in accordance with a predetermined rule for measuring the clean environment of the cells to which the measuring unit has been transferred.

More preferably, the measuring unit includes a vibration sensor arranged to measure vibrations applied to the measuring unit during transportation by the retrieval and storage apparatus, and the automated warehouse includes a limiting device arranged to limit operation of the retrieval and storage apparatus to maintain vibrations applied to an article during transportation of the article at a predetermined level or less.

Further, according to another preferred embodiment of the present invention, an automated warehouse includes a retrieval and storage apparatus, cells and a vibration measuring unit, and the retrieval and storage apparatus is arranged to transport the vibration measuring unit, and transfer the vibration measuring unit to and from the cells.

The vibration measuring unit is arranged to measure vibrations during transportation by the retrieval and storage apparatus.

The automated warehouse further includes a limiting device arranged to limit operation of the retrieval and storage apparatus based on a measurement result by the vibration measuring unit to maintain vibrations applied to an article during transportation of the article at a predetermined level or less.

Preferably, the vibration measuring unit includes a static electricity sensor, and the limiting device is arranged to limit operation of the retrieval and storage apparatus based on a measurement result by the static electricity sensor.

In a preferred embodiment of the present invention, a clean environment in the entire automated warehouse can be measured using one or a small number of measuring units efficiently. Further, the measurement results are preferably fed back to control the fan filter unit or the opening of the exhaust port. In this manner, in each of the cells, cleanness is maintained at a predetermined level or more.

In the case where clean environment of only some of the cells in the automated warehouse is measured successively in accordance with a predetermined rule, and a clean environment of the nearby cells are estimated, the clean environment in the entire automated warehouse can be efficiently determined.

Further, in the case where the measuring unit has a vibration sensor, and operation of the retrieval and storage apparatus is limited in correspondence with measurement results of vibrations, the vibrations applied to article during transportation of the article can be minimized at a predetermined level or less, and the article is not affected adversely by the vibrations during transportation of the article.

Further, in the case where the measuring unit has a static electricity sensor and operation of the retrieval and storage apparatus is limited, an electrical charge of the transported article can be maintained at a predetermined level or less.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 1 is a plan view showing an automated warehouse according to a preferred embodiment of the present invention.

DETAILED DESCRIPTION OF PREFERRED EMBODIMENTS

Figure 2:
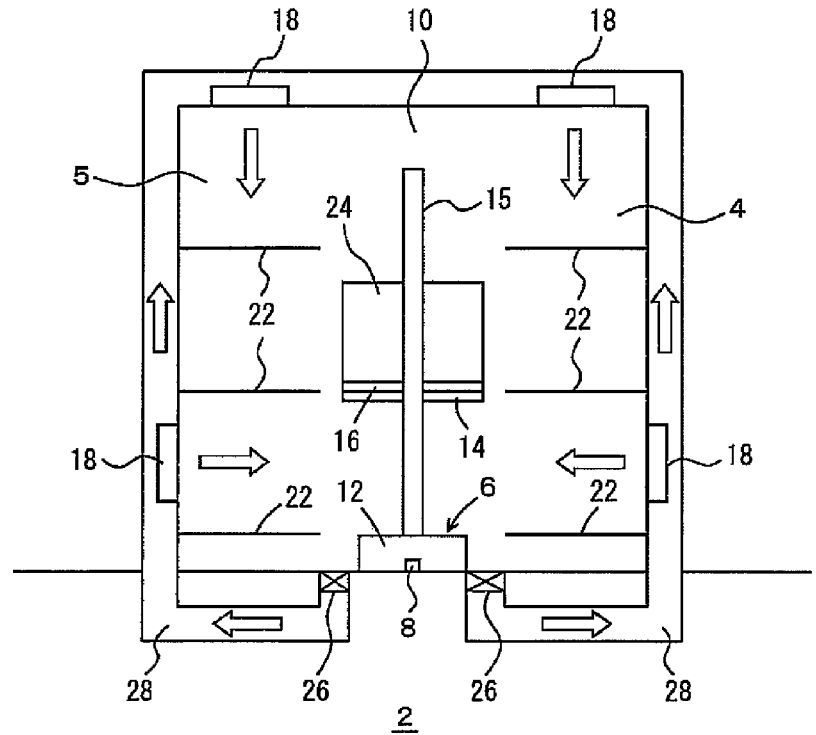
FIG. 2 is a front view showing a preferred embodiment of the present invention.

FIGS. 1 to 6 show an automated warehouse 2 according to preferred embodiments of the present invention. The automated warehouse 2 is preferably provided in a clean room. In FIG. 1, reference numerals 4 and 5 denote racks. A reference numeral 6 denotes a stacker crane as a retrieval and storage apparatus. However, other transportation apparatuses such as a conveyor may be used, for example. A reference numeral 8 denotes a travel rail of the stacker crane 6. A reference numeral 10 denotes a traveling space of the stacker crane 6. Alternatively, the racks may be provided only on one side of the traveling space 10. Further, some of the racks 4, 5 may be replaced with semiconductors or processing equipment such as a flat panel display, for example.

As shown, e.g., in FIG. 2, the stacker crane 6 has a carriage 12 and an elevation frame 14 that is elevated along a mast 15. The elevation frame 14 has a transportation apparatus 16 such as a slide fork or a SCARA arm, for example. Further, for example, a turn table arranged to rotate the transfer apparatus 16 together with articles may be provided between the elevation frame 14 and the transfer apparatus 16. Fan filter units (FFUs) 18 may be provided on the ceiling of the automated warehouse 2 and on sides of the automated warehouse 2, e.g., on the back surface side of the cells in the lowest stage to supply clean air. In FIG. 1, although the FFUs 18 are preferably provided at the same pitch as the cells 22, the actual layout of the FFUs 18 can be determined arbitrarily. Further, the FFUs 18 are preferably provided on the back surface side of the cells 22 in the lowest stage because flow of the clean air from the FFUs 18 at the ceiling does not reach the bottoms of the cells 22 easily, and it is effective to prevent entry of travel wind from the stacker crane 6.

A charging station 19 may be provided at one position of the racks 4, 5 so that a measuring unit 24 can be charged by the charging station 19. Further, the charging station 19 may have a communication interface arranged to communicate with the measuring unit 24 to acquire data from the measuring unit 24. A reference numeral 20 denotes a ground controller arranged to control the FFUs 18 and openings of exhaust valves described later, and the stacker crane 6. Reference numerals 22 denote the cells arranged to store, e.g., semiconductor cassettes such as semiconductors or cassettes for flat panel displays or the like. The types of the stored articles can be determined arbitrarily. In this preferred embodiment, it is assumed that flat panel displays are stored in the cells 22, and the cells 22 are provided in about two or three stages. Reference numerals 26 denote an exhaust valves provided adjacent to a floor of the automated warehouse 2. Each of the exhaust valves 26 has an adjustable opening. A reference numeral 28 denotes a return channel arranged to supply air circulating from the exhaust valve 26 to the FFUs 18.

Figure 3:
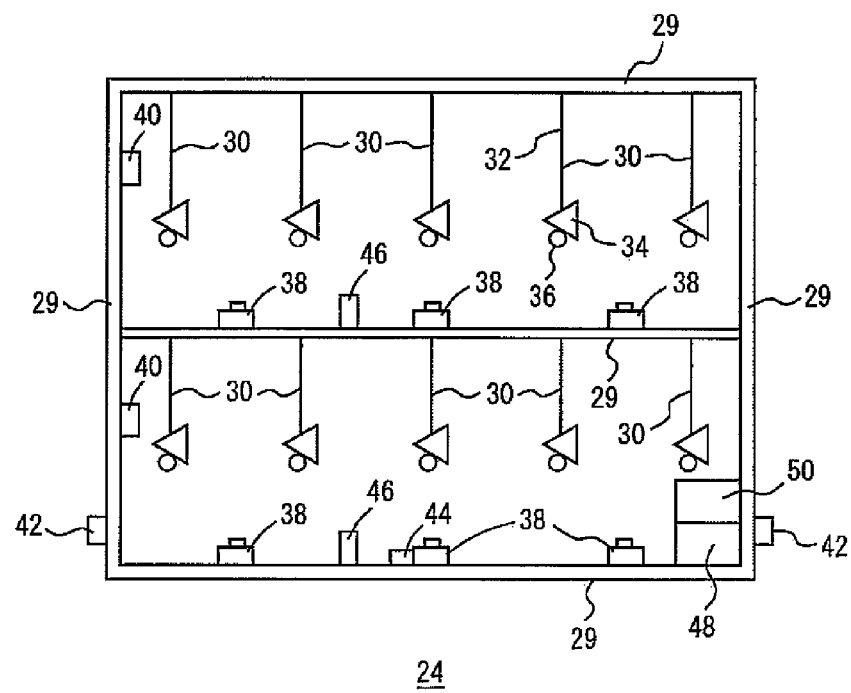
FIG. 3 is a side view showing a measuring unit used in a preferred embodiment of the present invention.

FIG. 3 shows structure of the measuring unit 24. Reference numeral 29 denotes a suitable frame. For example, the measuring unit 24 is divided into upper and lower stages. A partition arranged to divide the measuring unit 24 into upper and lower stages may or may not be provided. Alternatively, the measuring unit 24 may be partitioned into three or more stages. By the partition, change in the air flow at each height position can be detected, and by limiting the air flow in the height direction, the air flow can be horizontally directed. In each of upper and lower stages of the measuring unit 24, the tracers 30 are suspended from upper positions. Each of the tracers 30 preferably includes a string 32 and a windsail 34 provided at a lower end of the string 32, and a reflector 36. For example, the windsail 34 has a conical shape having an opening 35, and moves together with the reflector 36. The tracer 30 is displaced significantly by receiving weak wind inside the cell or on the elevation frame to accurately determine the orientation and the strength of the air flow. The shape of the windsail 34 is not limited to the conical shape. The string 32 may extend downwardly below the windsail 34 or the reflector 36. Further, the reflector 36 may or may not be provided. In this case, the position of the windsail 34 itself is imaged.

Reference numerals 38 denote strobe cameras. In general, the cameras 38 have a strobe light because space in the automated warehouse 2 is dark. The strobe light may be provided separately from the camera 38. For example, the reflector 36 is imaged from lower to upper positions, or from upper to lower positions. The range where the reflector 36 moves by the clean air is within a viewing field of the same camera 38. Therefore, the individual reflectors 36 can be identified from images of the camera 38. Further, for example, only one camera 38 may be used to image a plurality of the reflectors 36.

A reference numeral 40 denotes a particle counter. For example, the particle counter 40 measures the number and sizes of particles flowing through upper and lower stages of the measuring unit 24. Reference numerals 42 denote distance sensors. The distance sensor 42 measures the distance to a support column or the like of the cell where the measuring unit 24 is placed, for detecting accuracy of a transfer position the measuring unit 24.

A reference numeral 44 denotes a vibration sensor. For example, the vibration sensor 44 is provided in the center at the lower stage of the measuring unit 24. For example, the vibration sensor 44 includes an acceleration sensor. Preferably, the vibration sensor 44 measures vibrations applied to the measuring unit 24 in each of x direction, y direction, and z direction. Reference numerals 46 denote static electricity sensors. The static electricity sensors 46 may or may not be provided. For example, the static electricity sensor 46 detects a charged condition of a glass substrate of a flat panel display as a stored article. The glass substrate is charged electrically when it contacts clean air containing ions, or friction with a glass support member of a cassette (not shown) occurs during transportation. When the glass substrate is charged electrically, the circuit and transistors or the like on the glass substrate may be undesirably damaged. By charging the glass substrate, an electrical field is generated around the glass substrate. The electrical field is measured by the static electricity sensor 46. Though the static electricity sensor 46 may measure the orientation or the like of the electrical field, in the present preferred embodiment, the static electricity sensor 46 simply measures the strength of the electrical field.

A reference numeral 48 denotes a power source unit used as a power source for components such as the cameras 38, the particle counter 40, and the vibration sensor 44. For example, the power source unit 48 is charged by the charging station 19. A reference numeral 50 denotes a communication interface. The communication interface 50 communicates with, e.g., a wireless LAN (not shown) provided in the automated warehouse. Otherwise, when the communication interface 50 is placed on an elevation frame of a stacker crane, the communication interface 50 communicates with the stacker crane. Alternatively, instead of the above, the communication interface 50 may communicate with a communication interface provided in the charging station. During communication, a measurement result is outputted from the measuring unit 24, and an instruction regarding measurement is received from the opponent.

Figure 4:
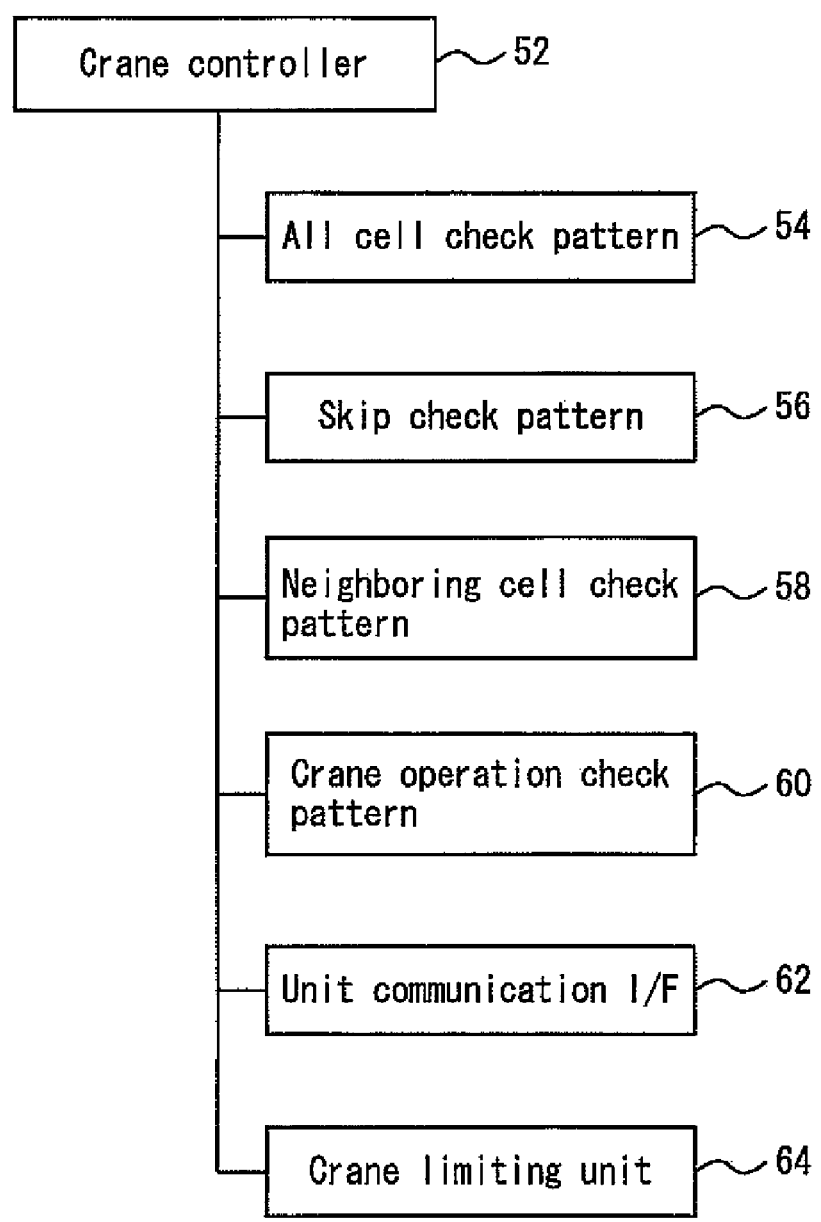
FIG. 4 is a block diagram showing a crane control unit used in a preferred embodiment of the present invention.

FIG. 4 shows an arrangement of a crane controller 52. The crane controller 52 preferably is an on board controller of the stacker crane. The crane controller 52 controls travel of the stacker crane, elevation of the elevation frame, and operation of the transfer apparatus. The crane controller 52 also transports the measuring unit to cells as targets of measurement transportation patterns to the target cells to be measured, which are stored. An all cell check pattern memory 54 stores a transportation pattern of the measuring unit so that the measuring unit can be passed to all of the cells in the automated warehouse to measure clean environment of all of the cells. Measurement of clean environment includes counting of particles, measurement of flow rate and orientation of air flow, and measurement of vibrations and static electricity.

A skip check pattern memory 56 stores a pattern of the cells for which a clean environment is measured such that the cells are distributed over the entire area of the automated warehouse, and a clean environment is measured for not all of, i.e., only some of the cells. The cells measured in accordance with the skip check pattern may not be fixed, and may be changed each time. A neighboring cell check pattern memory 58 stores data regarding articles where cells having problems in clean environment are detected, and a pattern indicating neighboring cells which are targets of measurement.

A crane operation check memory 60 stores a pattern for checking how the clean environment is changed by running, acceleration, and deceleration of the carriage, elevation, acceleration, and deceleration of the elevation frame, and operation of the transfer apparatus. In this pattern, for example, the measuring unit is placed in the cell, and the stacker crane is repeatedly operated around the cell where the measuring unit is placed, while changing conditions such as running, elevation, and operation of the transfer apparatus. In the meanwhile, the measuring unit measures the clean environment. A unit communication interface 62 is an interface for communication with the measuring unit. The unit communication interface 62 may not be provided. A crane limiting unit 64 limits, e.g., operation speed, acceleration, and deceleration of the crane in accordance with the measurement results of vibrations, static electricity, or the like.

Figure 5:
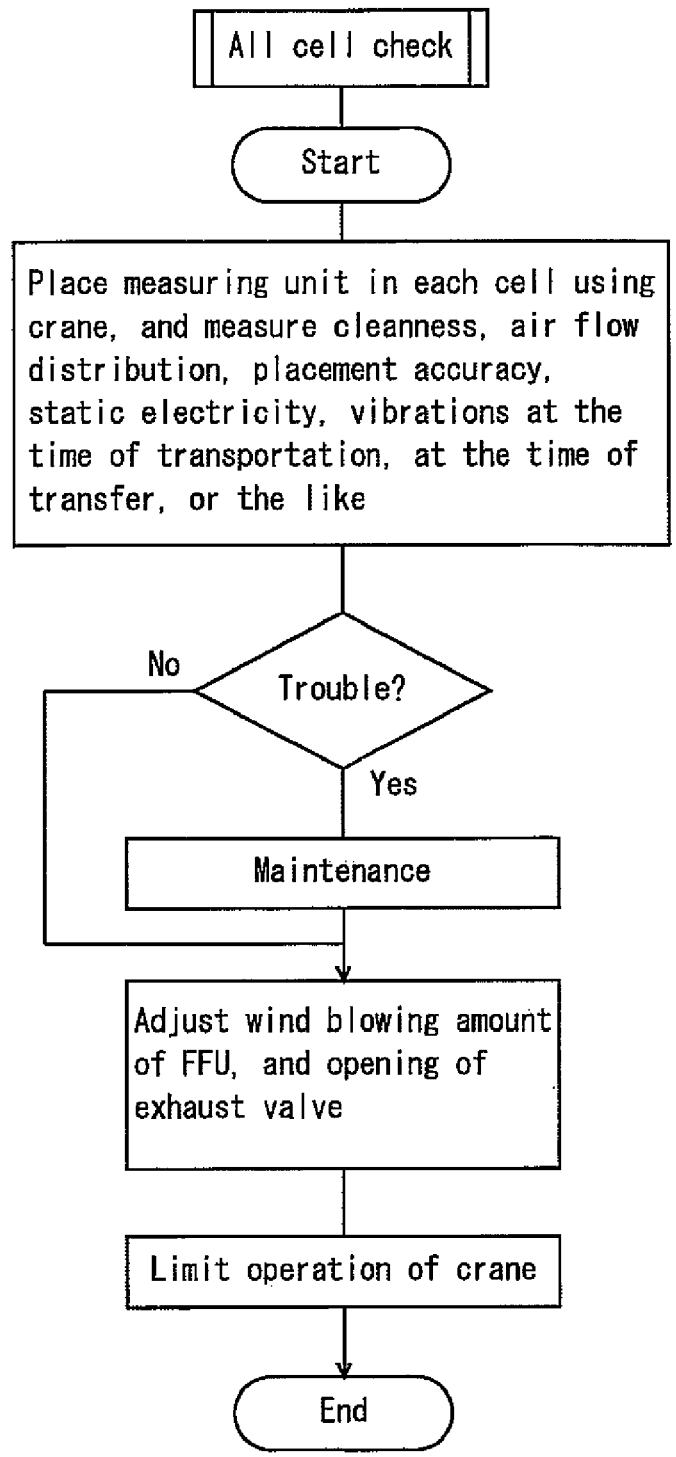
FIG. 5 is a flow chart showing an algorithm for checking all cells in a preferred embodiment of the present invention.

Operation of a preferred embodiment will be described. For example, at the time of completion of construction of the automated warehouse, or at the time of large-scale maintenance operation, a clean environment is measured for all of the cells, as is shown in FIG. 5. Using the stacker crane, the measuring unit is placed in each cell to measure the number and distribution of particles in the cell, distribution and the speed of the air flow, accuracy in placing the measuring unit, and the degree of static electricity. Further, at the time of transporting the measuring unit using the stacker crane, and at the time of transferring the measuring unit, the number and distribution of the particles, distribution and the speed of the air flow, accuracy in the position of the measuring unit, and vibrations and static electricity applied to the measuring unit are measured.

These results are transmitted from the wireless LAN or the like to the ground controller. If there is any data having a problem, a maintenance operation is performed for adjustment. Next, based on the measurement result of the particle counter, and the measurement results of the orientation and wind speed of the air flow, the air blowing amount of the fan filter unit and the openings of the exhaust valves are adjusted so that all of the cells have at least predetermined cleanness. In a case where the air flow is too strong, charging of articles such as glass substrate may occur. Therefore, also in correspondence with the measuring result of static electricity, the fan filter unit and the openings of the exhaust valves are adjusted. Further, in correspondence with the vibrations and the degree of static electricity, operation of the crane is limited. In the presence of particles beyond an allowable level, or in the case where the orientation and the strength of the air flow are abnormal, or in the presence of abnormal vibrations and abnormal static electricity, this situations are identified as problems, and the stacker crane is adjusted. In order to identify the causes of these problems, operating conditions of the stacker crane are changed. In this manner, the relationship between operation of the stacker crane and the abnormal conditions is identified.

Figure 6:
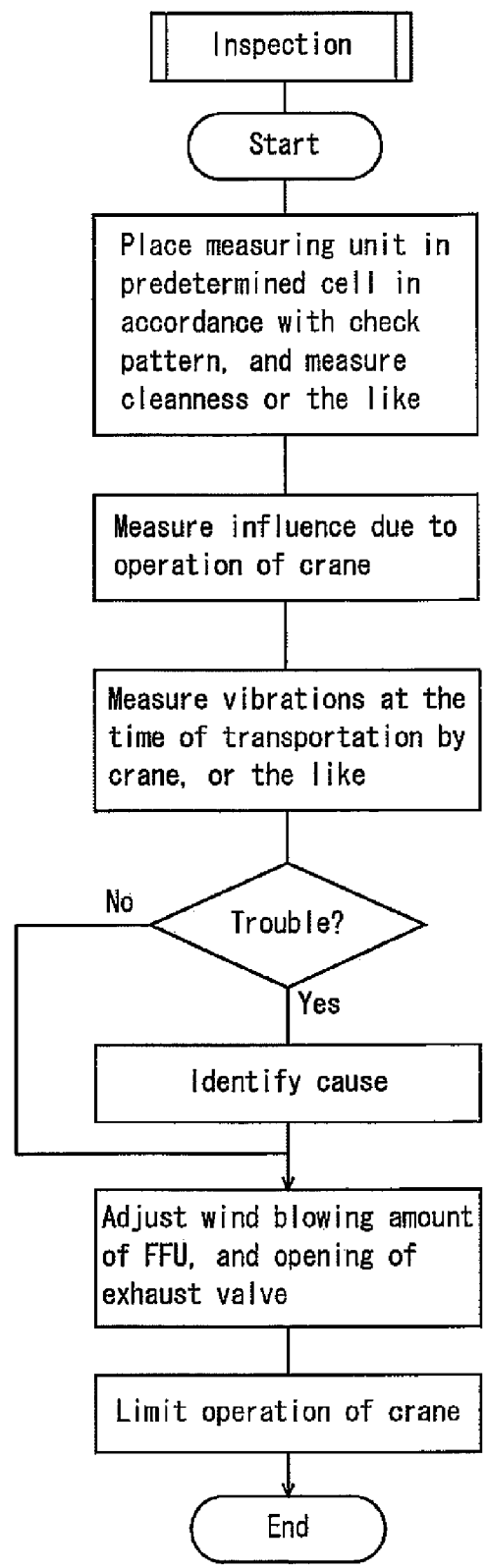
FIG. 6 is a flow chart showing an algorithm at the time of inspection in a preferred embodiment of the present invention.

FIG. 6 shows a pattern at the time of inspection. Inspection is performed periodically at a suitable timing after completion of construction of the automated warehouse. In accordance with the check pattern generated in the skip check pattern memory, the measuring unit is placed in a predetermined cell, and cleanness, vibrations, and the degree of static electricity are measured. Further, the accuracy in placing the measuring unit is measured. Then, for example, assuming that the measuring unit is kept placed in one cell, changes in the air flow and the number and sizes of the particles resulting from factors such as running, acceleration, and deceleration of the carriage, elevation, acceleration, and deceleration of the elevation frame, and operation of the transfer apparatus are measured, and influence on the clean environment by operation of the crane is measured. Further, the measuring unit is transported by the stacker crane. Vibrations during transportation, cleanness, the degree of static electricity, or the like are measured.

If there is any data having a problem, the causes of the problem are identified. The measuring unit is also placed in cells around the cell having a problem especially for measurement. Based on the results of analysis, maintenance operation or the like is performed. Even if there is no trouble, the blowing amount of the air from the fan filter unit, and the openings of the exhaust valves are adjusted so that the cleanness can be maintained uniformly in each of the cells. Further, in correspondence with the degree of vibrations during transportation and the degree of static electricity, the crane limiting unit limits, e.g., the maximum running speed, the maximum acceleration, and the maximum deceleration of the carriage, and the maximum elevation speed and the maximum acceleration of the elevation frame, and the transfer speed.

In the above described preferred embodiments, the following advantages are obtained.

(1) Using one measuring unit 24, the clean environment can be measured in the entire automated warehouse 2.

(2) Since the measurement result is used for feedback control of the fan filter unit and the openings of the exhaust valves, a clean environment is maintained at a predetermined level or more in each cell.

(3) The degree of vibrations applied to the articles during transportation by the stacker crane, the degree of the static electricity, the orientation and the speed of the air flow, the number of particles are measured to limit the running speed of the crane. Therefore, the articles are not affected significantly during transportation.

(4) At the time of completion of construction of the automated warehouse or the like, a clean environment is measured for all of the cells. Thereafter, measurement is performed for only some of the cells to efficiently measure the clean environment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An automated warehouse comprising:
a plurality of cells;
a fan filter unit arranged to supply clean air into the automated warehouse;
an exhaust vent from the automated warehouse having an adjustable opening;
a measuring unit arranged to measure a clean environment in the automated warehouse and including a power source unit;
a retrieval and storage apparatus arranged to transport the measuring unit and transfer the measuring unit to and from the plurality of cells; and
a control device arranged to control at least one of the fan filter unit and the adjustable opening of the exhaust vent to maintain the clean environment of the plurality of cells at a predetermined level or more based on measurement by the measuring unit of the clean environment of the cells; wherein
one of the plurality of cells is a charging station arranged to store the measuring unit and to charge the power source unit of the measuring unit.

2. The automated warehouse according to claim 1, wherein the retrieval and storage apparatus is arranged to selectively transfer the measuring unit to only some of the plurality of cells in the automated warehouse in accordance with a predetermined rule to measure the clean environment of the cells to which the measuring unit has been transferred or to transfer the measuring unit to all of the plurality of cells.

3. The automated warehouse according to claim 1, wherein the measuring unit includes a vibration sensor arranged to measure vibrations applied to the measuring unit during transportation by the retrieval and storage apparatus, and the automated warehouse further comprises a limiting device arranged to limit operation of the retrieval and storage apparatus to maintain vibrations applied to an article during transportation of the article at a predetermined level or less, based on measurement by the vibration sensor.

4. A method of controlling a clean environment in an automated warehouse comprising a plurality of cells, a retrieval and storage apparatus, a fan filter unit arranged to supply clean air, an exhaust vent from the automated warehouse having an adjustable opening, a measuring unit arranged to measure a clean environment in the automated warehouse and including a power source unit, the retrieval and storage apparatus transporting the measuring unit, and transferring the measuring unit to and from the plurality of cells, wherein one of the plurality of cells is a charging station; the method comprises the steps of:
measuring the clean environment of the plurality of cells by the measuring unit;
controlling at least one of the fan filter unit and the adjustable opening of the exhaust vent based on a measurement result to maintain the clean environment of the plurality of cells at a predetermined level or higher;
storing the measuring unit in the charging station; and
charging the power source unit in the charging station.

5. The method of controlling a clean environment according to claim 4, wherein the retrieval and storage apparatus performs the step of selectively transferring the measuring unit to only some of the plurality of cells in the automated warehouse in accordance with a predetermined rule to measure the clean environment of the cells to which the measuring unit has been transferred or transferring the measuring unit to all of the plurality of cells.

* * * * *